United States Patent
Lan et al.

(10) Patent No.: US 11,245,259 B2
(45) Date of Patent: Feb. 8, 2022

(54) POWER SUPPLY SYSTEM

(71) Applicant: Delta Electronics, Inc., Taoyuan (CN)

(72) Inventors: Lin Lan, Taoyuan (CN); Weiqiang Zhang, Taoyuan (CN)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 17/087,831

(22) Filed: Nov. 3, 2020

(65) Prior Publication Data

US 2021/0050723 A1 Feb. 18, 2021

Related U.S. Application Data

(63) Continuation-in-part of application No. 16/423,421, filed on May 28, 2019, now Pat. No. 10,886,711.

(30) Foreign Application Priority Data

Aug. 30, 2018 (CN) .......................... 201811001308.2

(51) Int. Cl.
*G06F 1/26* (2006.01)
*H02M 1/34* (2007.01)
(Continued)

(52) U.S. Cl.
CPC .................. *H02J 3/02* (2013.01); *G06F 1/26* (2013.01); *H02M 1/34* (2013.01); *H02M 7/043* (2013.01);
(Continued)

(58) Field of Classification Search
CPC ... H02M 7/003; H05K 7/1432; H05K 1/0256; H05K 1/14; H05K 7/20909;
(Continued)

(56) References Cited

U.S. PATENT DOCUMENTS 4,802,059 A * 1/1989 Prietzel ................. H01H 71/08
361/637
10,306,797 B2 5/2019 Sakalkar et al.
(Continued)

FOREIGN PATENT DOCUMENTS

CN 101207267 A 6/2008
CN 101299571 A 11/2008
(Continued)

OTHER PUBLICATIONS

The CN1OA issued Nov. 4, 2020 by the CNIPA.
The Notice Of Allowance dated Aug. 27, 2021 for CN patent application No. 201811001308.2.

*Primary Examiner* — Adam B Dravininkas
(74) *Attorney, Agent, or Firm* — Qinghong Xu

(57) ABSTRACT

Disclosed is a power supply system, including: a high-voltage input power distribution cabinet, a high-low voltage conversion cabinet, and a low-voltage output and control cabinet, the high-low voltage conversion cabinet is provided with at least one high-voltage chamber provided with a high-voltage bus bar, at least one low-voltage chamber provided with a low-voltage bus bar, an insulating partition between the high-voltage chamber and the low-voltage chamber and a plurality of power supply modules; each of the power supply modules bridges the high-voltage and low-voltage chambers and includes a high-voltage cavity, a low-voltage cavity and an isolation unit, connecting terminals of the high-voltage and low-voltage cavities are respectively disposed corresponding to the high-voltage and low-voltage chambers and electrically connected to the high-voltage and low-voltage bus bars respectively, and the isolation unit is connected to one end of the high-voltage cavity and one end of the low-voltage cavity.

17 Claims, 16 Drawing Sheets

(51) Int. Cl.
*H05K 7/20* (2006.01)
*H02M 7/04* (2006.01)
*H02M 1/32* (2007.01)
*H02J 3/02* (2006.01)

(52) U.S. Cl.
CPC ......... *H05K 7/20718* (2013.01); *H02M 1/327* (2021.05)

(58) Field of Classification Search
CPC ...... H05K 1/1485; H05K 1/1492; H02B 1/20; H02B 1/56; H02B 13/02; H02B 1/565; H02B 13/01; H02B 1/308
See application file for complete search history.

(56) References Cited

U.S. PATENT DOCUMENTS

| | | | | |
|---|---|---|---|---|
| 10,629,396 | B2* | 4/2020 | Skibinski | H05K 7/20145 |
| 2009/0159569 | A1* | 6/2009 | Kurogi | H02B 13/01 |
| | | | | 218/157 |
| 2009/0267466 | A1* | 10/2009 | Zook | H02B 1/50 |
| | | | | 312/223.6 |
| 2010/0328883 | A1* | 12/2010 | Ledezma | H05K 7/1432 |
| | | | | 361/690 |
| 2011/0299228 | A1* | 12/2011 | Milovac | H02B 11/26 |
| | | | | 361/614 |
| 2013/0032594 | A1 | 2/2013 | Smith | |

FOREIGN PATENT DOCUMENTS

| | | | | |
|---|---|---|---|---|
| CN | 202041553 U | 11/2011 | | |
| CN | 203562979 U | 4/2014 | | |
| CN | 204046018 U | 12/2014 | | |
| CN | 205178350 U | 4/2016 | | |
| CN | 205407040 U | 7/2016 | | |
| CN | 205622124 U | 10/2016 | | |
| CN | 106129879 A | 11/2016 | | |
| CN | 106159776 A | 11/2016 | | |
| CN | 206195223 U | 5/2017 | | |
| CN | 106992437 A | 7/2017 | | |
| CN | 207252112 U | 4/2018 | | |
| TW | I238590 B | 8/2005 | | |
| WO | WO-0064020 A1 * | 10/2000 | | E04H 5/04 |

* cited by examiner

POWER SUPPLY SYSTEM

CROSS REFERENCE

This application is a CIP of U.S. application Ser. No. 16/423,421, which is based upon and claims priority to Chinese Patent Application No. 201811001308.2, filed on Aug. 30, 2018, the entire contents thereof are incorporated herein by reference.

TECHNICAL FIELD

The disclosure relates to the technical field of power electronics, and more particularly, to a power supply system.

BACKGROUND

Datacenter, also known as a server center, refers to facilities used to house computer systems and related components, such as telecommunication and storage systems. It typically includes redundant and backup power supplies, redundant data communication connections, environmental controls (such as air conditioners, fire extinguishers) and various safety devices.

At present, the amount of data has exploded, the value of data has risen sharply, cloud computing has developed rapidly, and the scale of datacenters has maintained a rapid growth trend in recent years. In the context of rapid growth of the power consumption of the datacenters, it is urgent to reduce power transmission losses and optimize power supply manners in the datacenter.

The power supply technology requirements for application environments such as the datacenters are as follows:

(1) The diversity of input and output voltages of the system requires flexible combination of system structures to meet different voltage input and voltage output.

(2) For the needs of system architecture diversity, a modular structure is required to achieve different architectural requirements.

(3) For the safety requirements of power supply products, the isolation between high voltage and low voltage is required, so as to prevent high-voltage parts from being connected in series to the low-voltage circuit during on-line maintenance to cause personal injury to maintenance operators.

(4) Under the trend of continuous increase of the voltage level, the size of the medium-voltage power supply system will become larger and larger, a structure capable of reducing a creepage distance and clearance, having a small number of parts, and having a small system size and a light weight becomes necessary.

In the related art, the basic technical features of the existing solutions are: (1) single-phase power supply modules are connected in series; (2) all power supply modules are placed in one box; (3) there is no isolation structure of high voltage/low voltage in the cabinet body.

The shortcomings of this scheme are: (1) it cannot flexibly correspond to different input and output voltages; (2) it cannot flexibly correspond to different system architectures; (3) it cannot guarantee safety during live maintenance.

Therefore, in order to solve one or more of the above problems, a new power supply system solution is needed to flexibly isolate the high and low voltages and be suitable for a multi-power supply module system.

The above information disclosed in the background section is only for enhancement of understanding of the background of the present disclosure, and thus it may include information that does not constitute the prior art known to those of ordinary skill in the art.

SUMMARY

The aspects of the present disclosure may provide a power supply system that overcomes, at least to some extent, one or more problems due to limitations and disadvantages of the related art.

Other characteristics and advantages of the present disclosure will be apparent from the following detailed description or be learned in part by practicing the present disclosure.

According to an exemplary embodiment of the present disclosure, there is provided a power supply system, including: a high-voltage input power distribution cabinet, a high-low voltage conversion cabinet, and a low-voltage output and control cabinet, wherein, the high-low voltage conversion cabinet is provided with at least one high-voltage chamber and at least one low-voltage chamber, the high-low voltage conversion cabinet is further provided with an insulating partition between the high-voltage chamber and the low-voltage chamber, the low-voltage chamber provided with a low-voltage bus bar, and the high-voltage chamber is provided with a high-voltage bus bar;

the high-low voltage conversion cabinet is further provided with a plurality of power supply modules, and each of the power supply modules bridges the high-voltage chamber and the low-voltage chamber, the power supply module includes a high-voltage cavity, a low-voltage cavity and an isolation unit, wherein a connecting terminal of the high-voltage cavity and a connecting terminal of the low-voltage cavity are respectively disposed corresponding to the high-voltage chamber and the low-voltage chamber and electrically connected to the high-voltage bus bar and the low-voltage bus bar respectively, and the isolation unit is connected to one end of the high-voltage cavity and one end of the low-voltage cavity.

It is to be understood that both the foregoing general description and the following detailed description are exemplary and explanatory only and are not restrictive of the invention, as claimed.

BRIEF DESCRIPTION OF THE DRAWINGS

The above and other objects, features and advantages of the present disclosure will become more apparent from the detailed descriptions of exemplary embodiments with reference to the drawings.

DETAILED DESCRIPTION

Figure 1:
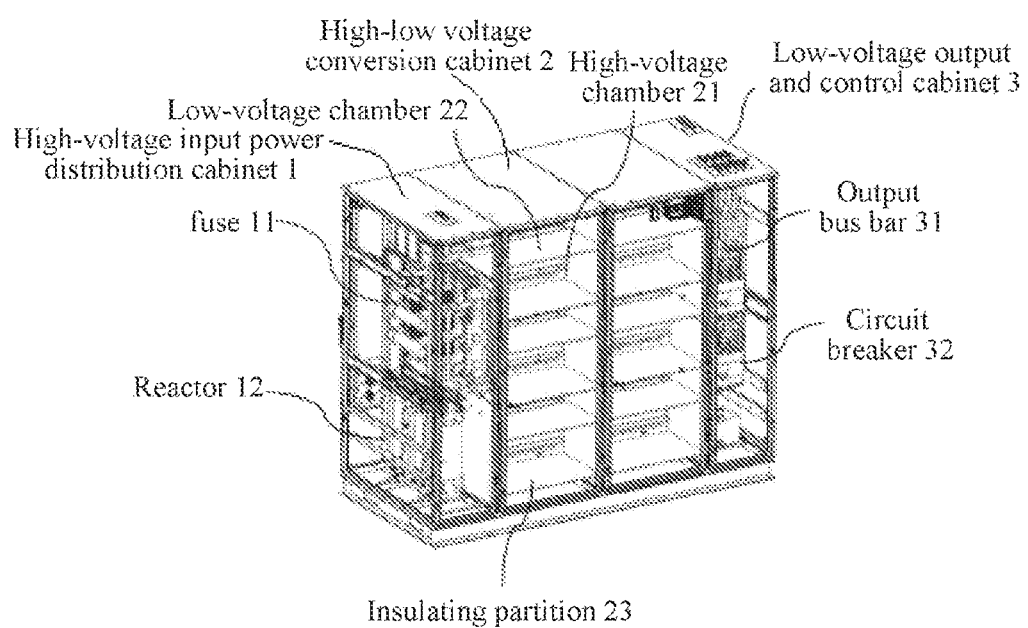
FIG. 1 is a front side stereogram of a power supply system according to an embodiment of the present disclosure.

Exemplary embodiments will now be described more fully with reference to the accompanying drawings. However, the exemplary embodiments may be implemented in many forms and should not be construed as being limited to the examples set forth herein; instead, these exemplary embodiments are provided so that this disclosure will be thorough and complete, and the concepts of the exemplary embodiments will be comprehensively conveyed to those skilled in the art. The drawings are only schematic representations of the present disclosure and are not necessarily to be drawn to scale. The same reference numerals in the drawings represent the same or similar parts, and thus their repeated description will be omitted.

Furthermore, the described features, structures, or characteristics may be combined in one or more exemplary embodiments by using any suitable manner. In the following description, numerous specific details are set forth to provide full understanding of the exemplary embodiments of the present disclosure. However, those skilled in the art should appreciate that the technical solutions of the present disclosure may be practiced without one or more of the foregoing specific details, or other methods, constituent elements, steps, etc. may be adopted. In other instances, well-known structures, methods, implementations, or operations are not shown or described in detail to avoid obscuring various aspects of the present disclosure.

Embodiments of the present disclosure provide a power supply system, including: a high-voltage input power distribution cabinet, a high-low voltage conversion cabinet, and a low-voltage output and control cabinet, wherein the high-low voltage conversion cabinet is provided with at least one high-voltage chamber and at least one low-voltage chamber, the high-low voltage conversion cabinet is further provided with an insulating partition between the high-voltage chamber and the low-voltage chamber, the low-voltage chamber is provided with a low-voltage bus bar, and the high-voltage chamber is provided with a high-voltage bus bar; the high-low voltage conversion cabinet is further provided with a plurality of power supply modules, and each of the power supply modules bridges the high-voltage chamber and the low-voltage chamber, the power supply module includes a high-voltage cavity, a low-voltage cavity and an isolation unit, wherein the high-voltage cavity and the low-voltage cavity are respectively disposed corresponding to the high-voltage chamber and the low-voltage chamber and electrically connected to the high-voltage bus bar and the low-voltage bus bar respectively, and the isolation unit is connected to one end of the high-voltage cavity and one end of the low-voltage cavity outside the high-voltage chamber and the low-voltage chamber to achieve the electrical isolation between the power supply module and the outside. The power supply system of the embodiments improves safety by isolating the input high voltage, the output low voltage and the control low voltage. Further, the high-voltage cavity, low-voltage cavity and a combination thereof can be used for a variety of different system architectures.

Embodiments of the present disclosure further provide a power supply system, including: a high-voltage input power distribution cabinet, a high-low voltage conversion cabinet, and a low-voltage output and control cabinet, wherein the high-low voltage conversion cabinet is provided with at least one high-voltage chamber and at least one low-voltage chamber, the high-low voltage conversion cabinet is further provided with an insulating partition between the high-voltage chamber and the low-voltage chamber, the low-voltage chamber is provided with a low-voltage bus bar, and the high-voltage chamber is provided with a high-voltage bus bar; the high-low voltage conversion cabinet is further provided with a plurality of power supply modules, and each of the power supply modules bridges the high-voltage chamber and the low-voltage chamber, the power supply module comprises a high-voltage cavity, a low-voltage cavity and an isolation unit, wherein a connecting terminal of the high-voltage cavity and a connecting terminal of the low-voltage cavity are respectively disposed corresponding to the high-voltage chamber and the low-voltage chamber and electrically connected to the high-voltage bus bar and the low-voltage bus bar respectively, and the isolation unit is connected to one end of the high-voltage cavity and one end of the low-voltage cavity.

Figure 2:
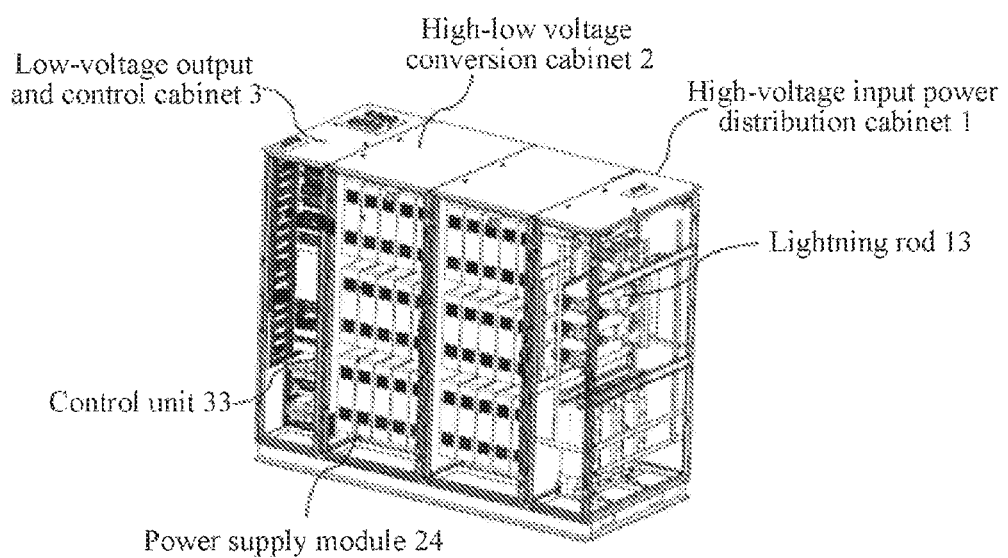
FIG. 2 is a rear side stereogram of a power supply system according to an embodiment of the present disclosure.
Figure 3:
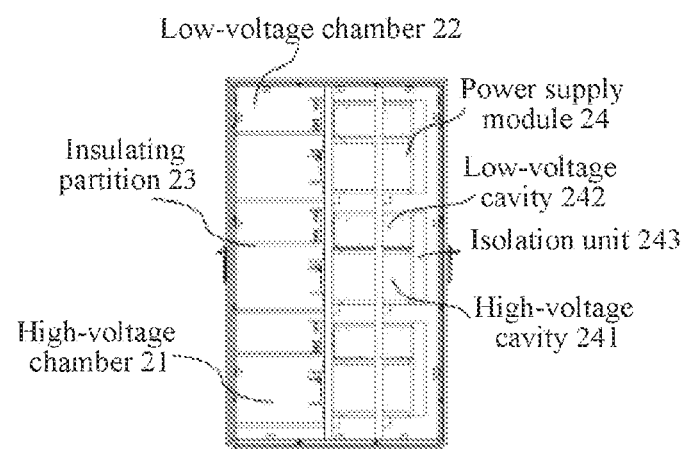
FIG. 3 is a side view of a high-low voltage conversion cabinet of a power supply system according to an embodiment of the present disclosure.
Figure 4:
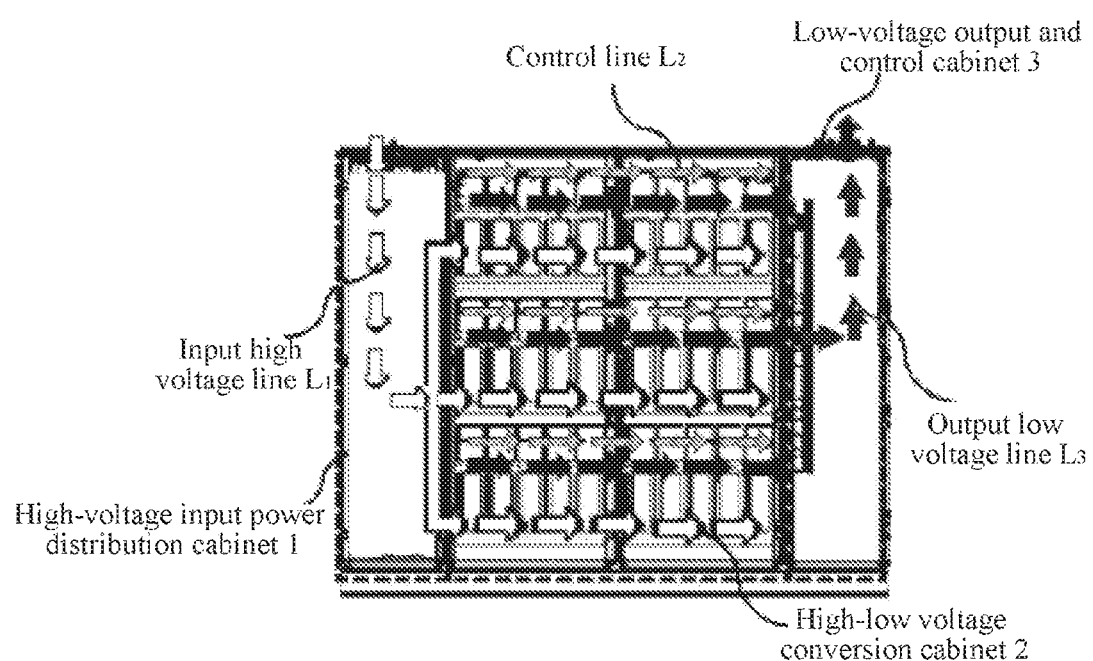
FIG. 4 is a rear view of a power supply system according to a first exemplary embodiment of the present disclosure.
Figure 5:
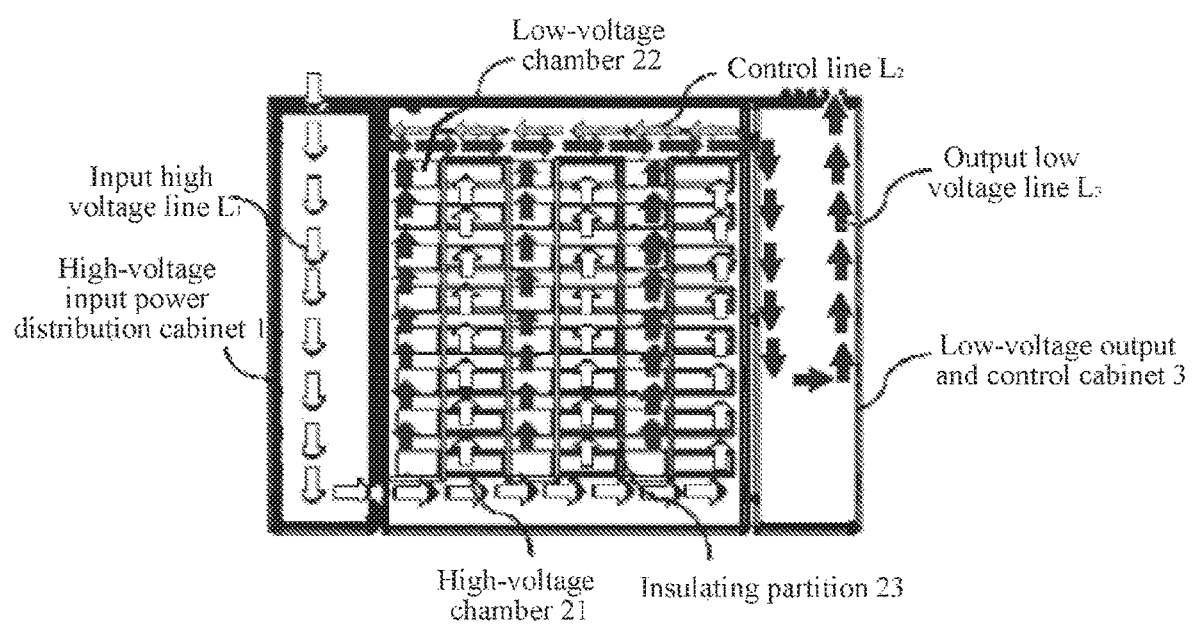
FIG. 5 is a rear view of a power supply system according to a second exemplary embodiment of the present disclosure.
Figure 6:
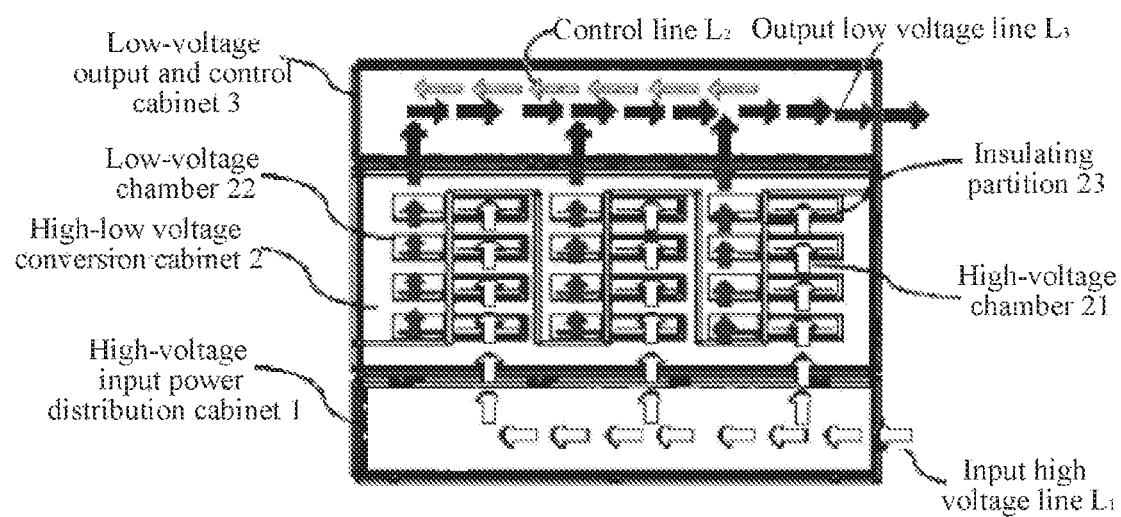
FIG. 6 is a rear view of a power supply system according to a third exemplary embodiment of the present disclosure.
Figure 7:
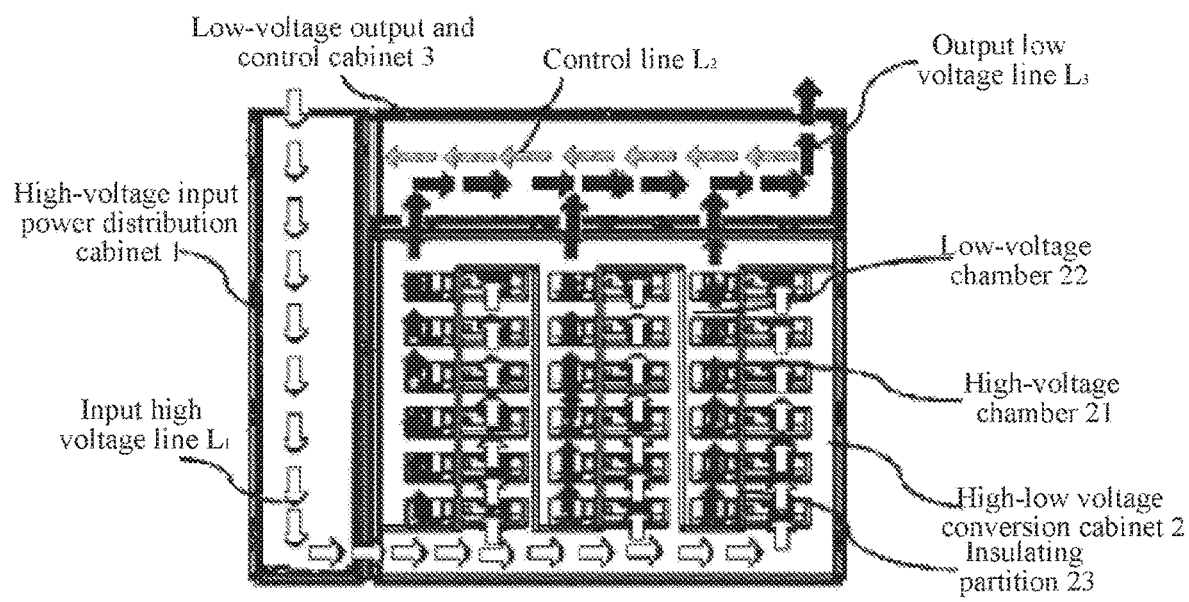
FIG. 7 is a rear view of a power supply system according to a fourth exemplary embodiment of the present disclosure.
Figure 8:
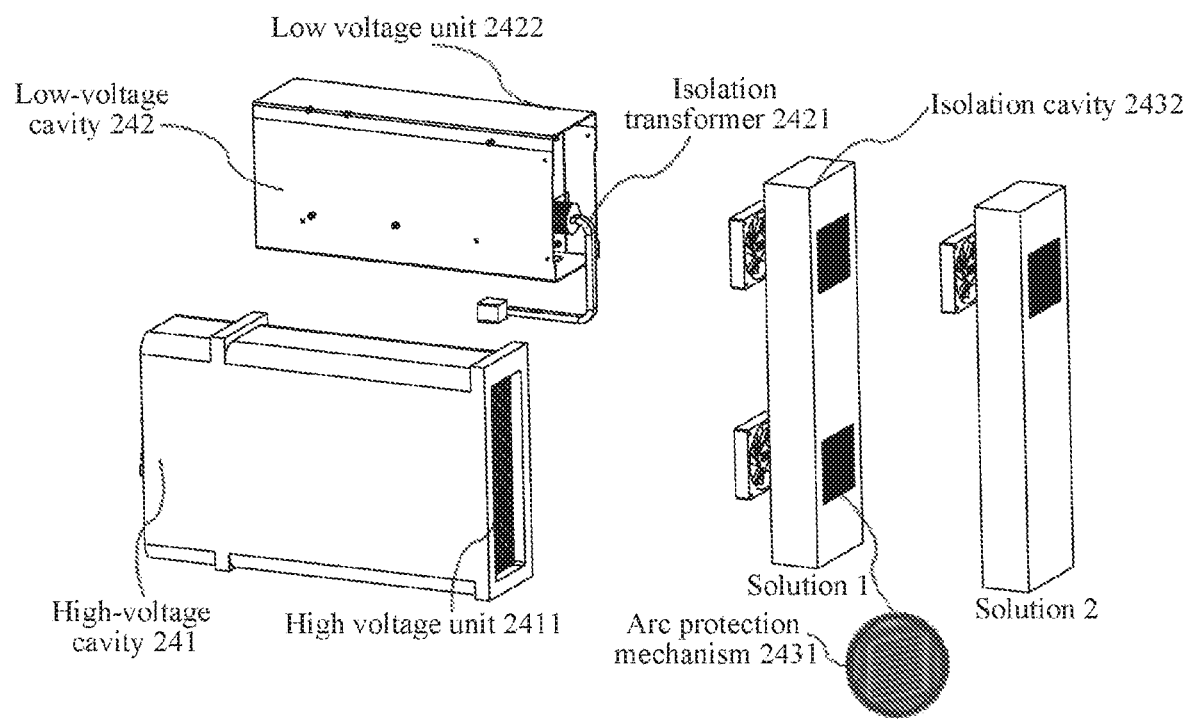
FIG. 8 is an exploded view of a specific structure of the power supply module.
Figure 9:
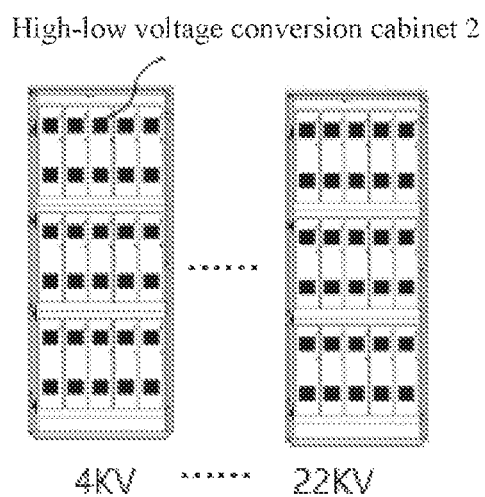
FIG. 9 is a schematic diagram of a plurality of high-low voltage conversion cabinets.
Figure 10:
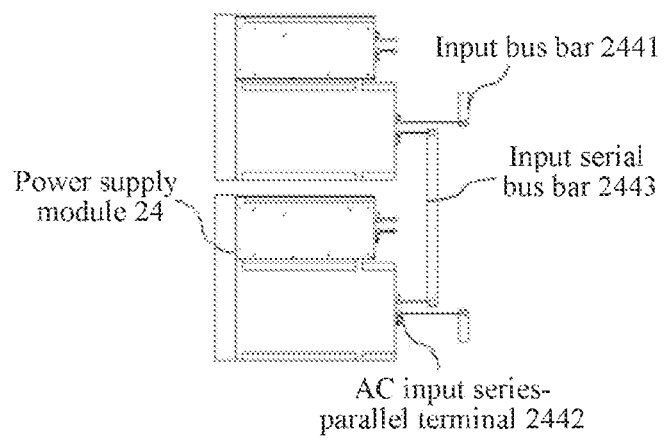
FIG. 10 is a schematic diagram in which inputs of a plurality of power supply module are connected in series.
Figure 11:
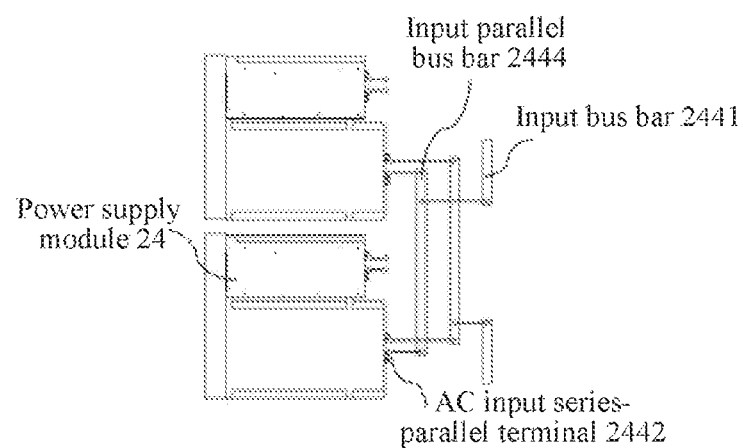
FIG. 11 is a schematic diagram in which inputs of a plurality of power supply module are connected in parallel.
Figure 12:
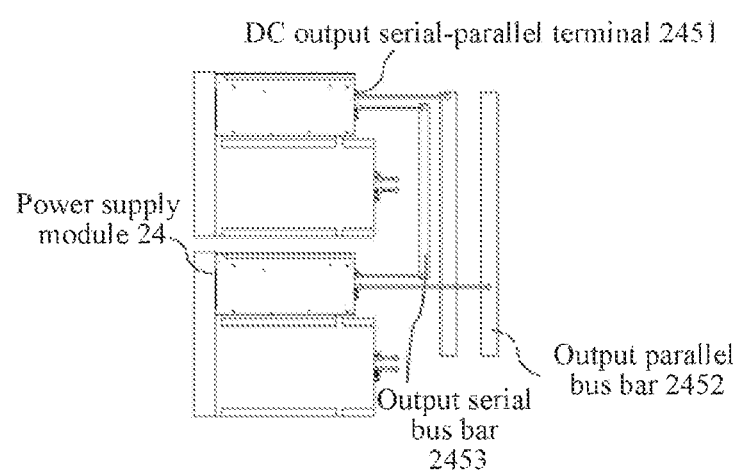
FIG. 12 is a schematic diagram in which outputs of a plurality of power supply modules are connected in series.
Figure 13:
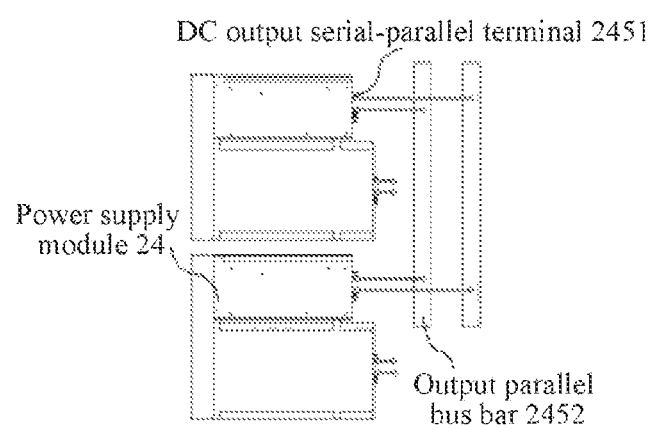
FIG. 13 is a schematic diagram in which outputs of a plurality of power supply modules are connected in parallel.
Figure 14:
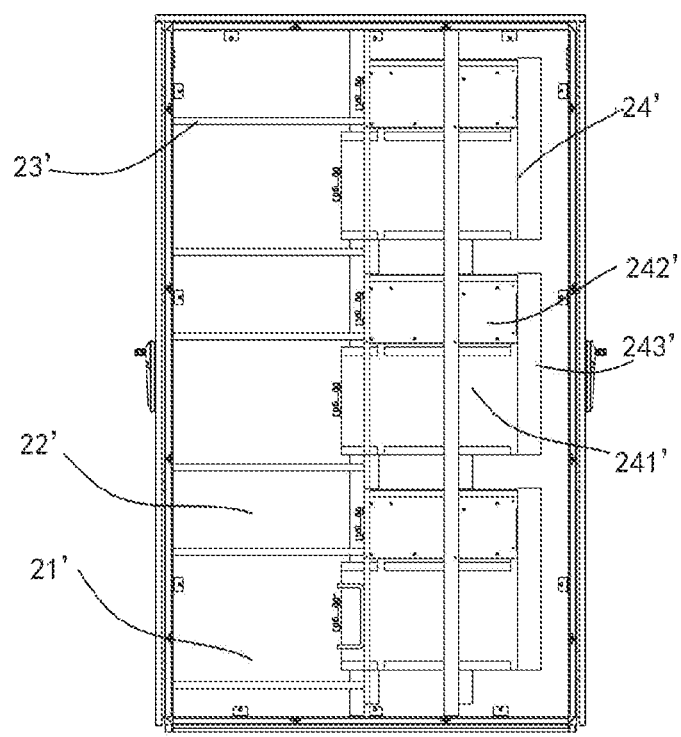
FIG. 14 is a side view of a high-low voltage conversion cabinet of a power supply system according to another embodiment of the present disclosure.
Figure 15:
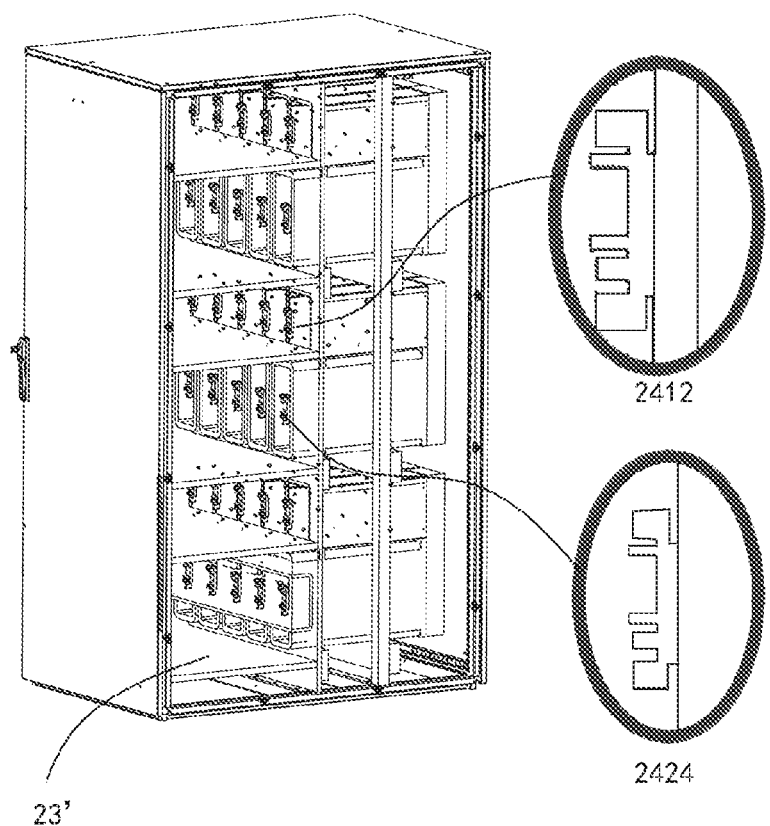
FIG. 15 is another side view of the high-low voltage conversion cabinet of the power supply system according to another embodiment of the present disclosure.
Figure 16:
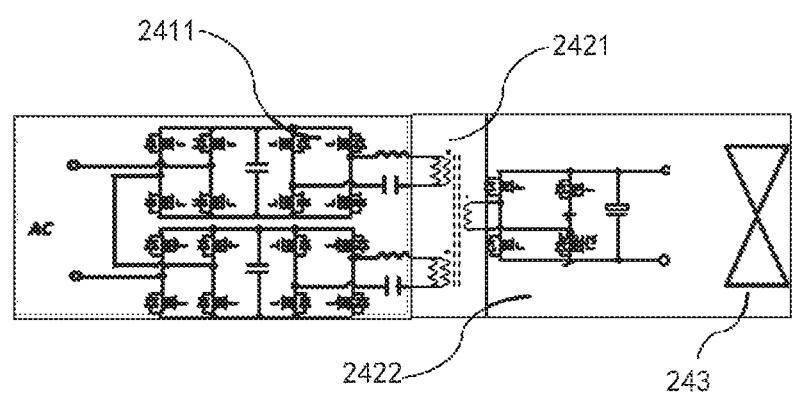
FIG. 16 is a circuit diagram of the power supply module according to an embodiment of the present disclosure.

The power supply system of the present disclosure will be described in detail below with reference to FIG. 1 to FIG. 15, wherein FIG. 1 is a front side stereogram of a power supply system according to an embodiment of the present disclosure; FIG. 2 is a rear side stereogram of a power supply system according to an embodiment of the present disclosure; FIG. 3 is a side view of a high-low voltage conversion cabinet of a power supply system according to an embodiment of the present disclosure; FIG. 4 is a rear view of a power supply system according to the first exemplary embodiment of the present disclosure; FIG. 5 is a rear view of a power supply system according to the second exemplary embodiment of the present disclosure; FIG. 6 is a rear view of a power supply system according to the third exemplary embodiment of the present disclosure; FIG. 7 is a rear view of a power supply system according to the fourth exemplary embodiment of the present disclosure; FIG. 8 is an exploded view of the specific structure of the power supply module; FIG. 9 is a schematic diagram of a plurality of high-low voltage conversion cabinets; FIG. 10 is a schematic diagram in which inputs of a plurality of power supply modules are connected in series; FIG. 11 is a schematic diagram in which inputs of a plurality of power supply modules are connected in parallel; FIG. 12 is a schematic diagram in which outputs of a plurality of power supply modules are connected in series; FIG. 13 is a schematic diagram in which outputs of a plurality of power supply modules are connected in parallel; FIG. 14 is a side view of a high-low voltage conversion cabinet of a power supply system according to another embodiment of the present disclosure; FIG. 15 is another side view of the high-low voltage conversion cabinet of the power supply system according to another embodiment of the present disclosure; and FIG. 16 is a circuit diagram of the power supply module according to an embodiment of the present disclosure.

As shown in FIG. 1 to FIG. 4, the power supply system includes: a high-voltage input power distribution cabinet 1, a high-low voltage conversion cabinet 2, and a low-voltage output and control cabinet 3, wherein the high-low voltage conversion cabinet 2 is provided with at least one high-voltage chamber 21 and at least one low-voltage chamber 22, the high-low voltage conversion cabinet 2 is further provided with an insulating partition 23 between the high-voltage chamber 21 and the low-voltage chamber 22, the low-voltage chamber 22 may be provided with a low-voltage bus bar (not shown in the figure), and the high-voltage chamber 21 is provided with a high-voltage bus bar (not shown in the figure), so as to separate the high-voltage bus bar from the low voltage bus bar; the high-low voltage conversion cabinet is further provided with a plurality of power supply modules 24, and each of the power supply modules 24 bridges one high-voltage chamber 21 and one low-voltage chamber 22, the power supply module includes a high-voltage cavity 241, a low-voltage cavity 242 and an isolation unit 243, wherein the high-voltage cavity 241 and the low-voltage cavity 242 are respectively disposed corresponding to the high-voltage chamber 21 and the low-voltage chamber 22 and electrically connected to the high-voltage bus bar and the low-voltage bus bar respectively, and the isolation unit 243 is connected to one end of the high-voltage cavity 241 and one end of the low-voltage cavity 242 to achieve the electrical isolation between the power supply modules 24 and the outside, that is, it may achieve the electrical isolation between the power supply modules 24 and the outside of the high-low voltage conversion cabinet 2 and even the outside of the power supply system.

In another embodiment, as shown in FIG. 14 to FIG. 15, the power supply system includes: a high-voltage input power distribution cabinet 1, a high-low voltage conversion cabinet 2', and a low-voltage output and control cabinet 3, wherein the high-low voltage conversion cabinet 2' is provided with at least one high-voltage chamber 21' and at least one low-voltage chamber 22', the high-low voltage conversion cabinet 2' is further provided with an insulating partition 23' between the high-voltage chamber 21' and the low-voltage chamber 22', the low-voltage chamber may be provided with a low-voltage bus bar (not shown in the figure), and the high-voltage chamber 21' is provided with a high-voltage bus bar (not shown in the figure); the high-low voltage conversion cabinet 2' is further provided with a plurality of power supply modules 24', and each of the power supply modules 24' bridges one high-voltage chamber 21' and one low-voltage chamber 22', the power supply module includes a high-voltage cavity 241', a low-voltage cavity 242' and an isolation unit 243', wherein a connecting terminal (i.e., a high-voltage terminal) 2412 of the high-voltage cavity 241' and a connecting terminal (i.e., a low-voltage terminal) 2424 of the low-voltage cavity 242' are respectively disposed corresponding to the high-voltage chamber 21' and the low-voltage chamber 22' and electrically connected to the high-voltage bus bar and the low-voltage bus bar respectively, and the isolation unit 243' is connected to one end of the high-voltage cavity 241' and one end of the low-voltage cavity 242' to achieve the electrical isolation between the power supply modules 24' and the outside, that is, it may achieve the electrical isolation between the power supply modules 24' and the outside of the high-low voltage conversion cabinet 2' and even the outside of the power supply system.

As shown in FIG. 14 and FIG. 15, the connecting terminal 2412 of the high-voltage cavity 241' is disposed corresponding to the high-voltage chamber 21', and the connecting terminal 2424 of the low-voltage cavity 242' is disposed corresponding to the low-voltage chamber 22'. It is unnecessary to align the high-voltage cavity 241' with the high-voltage chamber 21', and the high-voltage cavity 241' and the high-voltage chamber 21' may be disposed in a staggered manner. Similarly, it is unnecessary to align the low-voltage cavity 242' with the low-voltage chamber 22', and the low-voltage cavity 242' and the low-voltage chamber 22' may be disposed in a staggered manner. In this way, the insulating partition 23' can be moved up and down according to actual needs, and the sizes of the high-voltage chamber 21' and the low-voltage chamber 22' can be flexibly changed according to actual needs.

Further, the high-voltage input power distribution cabinet 1 may be provided with a fuse 11, a reactor 12 and a lightning rod 13; the low-voltage output and control cabinet 3 may be provided with an output bus bar 31 and a circuit breaker 32, and the output bus bar 31 may be electrically connected to the low voltage bus bar for external output of the cabinet.

It should be specially stated here that the high-voltage chamber and the low-voltage chamber may be one or more than one. In the case that there are only one high-voltage chamber and one low-voltage chamber, one high-voltage chamber may correspond to a plurality of high-voltage cavities, and one low-voltage chamber may correspond to a plurality of low-voltage cavities, that is, one group of the high-voltage chamber and the low-voltage chamber corresponds to the high-voltage cavities and the low-voltage cavities of a plurality of power supply modules. In the case that there are a plurality of the high-voltage chambers and the low-voltage chambers, the number of the power supply modules may be the same as that of the high-voltage/low-voltage chambers, and they are connected in a one-to-one correspondence, but the present disclosure is not limited thereto. The number of the power supply modules may be greater than the number of the high-voltage and low-voltage chambers, and one high-voltage/low-voltage chamber may correspond to multiple high-voltage/low-voltage cavities (that is, they correspond to multiple power supply modules).

The power supply system according to an embodiment of the present disclosure can improve safety by isolating the input high voltage, the output low voltage and the control low voltage. Meanwhile, the additional protection of the low voltage portion is reduced, so that the number and types of parts are reduced, in addition, the electric clearance and the creepage distance between the high-voltage chamber and the low-voltage chamber, and the electric clearance and the creepage distance between the high-voltage cavity and the low-voltage cavity are reduced, so that the size and weight of cabinet body are reduced. Further, the high-voltage cavity, the low-voltage cavity and a combination thereof may be used for a variety of different system architectures.

According to an exemplary embodiment of the present disclosure, there are a plurality of the high-voltage chambers, a plurality of the low-voltage chambers, and a plurality of the insulating partitions. The high-voltage chambers and the low-voltage chambers may be alternately arranged in a vertical direction, as shown in FIG. 1 to FIG. 4. In the vertical direction, the high-voltage chambers and the low-voltage chambers are alternately arranged, and the insulating partitions are provided between the high-voltage chambers and low-voltage chambers. Each group of the high-voltage chamber and the low-voltage chamber may correspond to the high-voltage cavities and the low-voltage cavities of a plurality of power supply modules. The high-voltage chamber and the low-voltage chamber may be a horizontal rectangular parallelepiped as shown in FIG. 1, high-voltage bus bars and low-voltage bus bars with long stipe shapes may be respectively arranged in the high-voltage chamber and the low-voltage chamber, and the high-voltage bus bars and the low-voltage bus bars may be arranged correspondingly and horizontally. The high-voltage cavities and the low-voltage cavities of the plurality of power supply modules may respectively and correspondingly connect to the high-voltage bus bars and the low-voltage bus bars, so as to realize multiple output connection modes such as parallel connection, series connection, series-parallel connection, etc., but the present disclosure is not limited thereto.

According to an exemplary embodiment of the present disclosure, the high-voltage input power distribution cabinet, the high-low voltage conversion cabinet, and the low voltage output and the control cabinet are sequentially arranged in a horizontal direction, as shown in FIG. 4 and FIG. 5, wherein white arrows indicate the distribution of the input high voltage line $L_1$, the white arrows in the portion of the high-low voltage conversion cabinet virtualizing the high voltage bus bars; black arrows indicate the distribution of the output low voltage line $L_3$, the black arrows virtualizing the low voltage bus bar in the portion of the high-low voltage conversion cabinet; and arrows with oblique lines indicate the distribution of the control line $L_2$.

It should be specially noted that, in order to more clearly show the distribution of the input high voltage line $L_1$, the control line $L_2$ and the output low voltage line $L_3$, the specific structures and components of the high-voltage input power distribution cabinet and the low-voltage output and control cabinet are omitted in FIGS. 4 to 7 (not shown in the drawings).

In FIG. 4, the cabinet bodies of the high-voltage input power distribution cabinet 1, the high-low voltage conversion cabinet 2 and the low-voltage output and control cabinet 3 are arranged in the horizontal direction, the high-voltage power inputted into the high-voltage input power distribution cabinet 1 is transmitted to the power supply modules along the high-voltage bus bars horizontally arranged, and is transferred to the low-voltage output and control cabinet through the low voltage bus bars arranged horizontally after being converted into low-voltage power via the power supply modules. It is simple for wiring, and it is convenient to achieve the isolation between the high voltage and low voltage in each cabinet body.

According to an exemplary embodiment of the present disclosure, there are provided with a plurality of the high-voltage chambers, a plurality of the low-voltage chambers, and a plurality of the insulating partitions, and the high-voltage chambers and the low-voltage chambers are alternately arranged in a horizontal direction, as shown in FIG. 5.

In FIG. 5, the cabinet bodies of the high-voltage input power distribution cabinet 1, the high-low voltage conversion cabinet 2 and the low-voltage output and control cabinet 3 are horizontally distributed, but the corresponding high-voltage chambers and low-voltage chambers are alternately arranged in a horizontal direction. The high-voltage chamber and the low-voltage chamber may be a vertical rectangular parallelepiped as shown in FIG. 5, and high-voltage bus bars and low-voltage bus bars with long stipe shapes may be respectively arranged in the high-voltage chamber and the low-voltage chamber. The high-voltage power inputted into the high-voltage input power distribution cabinet 1 is transmitted to the power supply modules along the high-voltage bus bars vertically arranged, and is transferred to the low voltage output and control cabinet through the low-voltage bus bars arranged vertically after being converted into low-voltage power via the power supply modules. In this wiring method, multiple turns are required, so as to achieve the isolation of the high voltage and low voltage in each cabinet body.

In an embodiment, the high-low voltage conversion part, the high-voltage input part, and the low-voltage output and control part may be made as separate cabinet bodies to be isolated from each other, or may be placed in the same cabinet body and separated by partitions. In the high-low voltage conversion cabinet, the power supply module is vertically expanded, and the partitions are vertically installed to form the high-voltage/low-voltage chamber, wherein the high-voltage chambers and low-voltage chambers are arranged at intervals. The partition isolates the input high voltage, the output low voltage and the control low voltage, which reduces the electric clearance and the creepage distance between the high-voltage chamber and the low-voltage chamber and the clearance and the creepage distance between the high-voltage cavities and the low-voltage cavities, thereby reducing the size and weight of the cabinet bodies and types of the components.

According to an exemplary embodiment of the present disclosure, the high-voltage input power distribution cabinet, the high-low voltage conversion cabinet, and the low-voltage output and control cabinet are sequentially arranged in a vertical direction, as shown in FIG. 6, wherein white arrows indicates the distribution of the input high voltage line $L_1$, and the white arrows in the portion of the high-low voltage conversion cabinet virtualize the high voltage bus bar; black arrows indicates the distribution of the output low voltage line $L_3$, and the black arrows in the portion of the high-low voltage conversion cabinet virtualize the low voltage bus bar; and arrows with oblique lines indicate the distribution of the control line $L_2$.

In FIG. 6, the cabinet bodies of the high-voltage input power distribution cabinet 1, the high-low voltage conversion cabinet 2, and the low-voltage output and control cabinet 3 are arranged in a vertical direction, but the corresponding high-voltage chambers and low-voltage chambers are alternately arranged in a horizontal direction. The high-voltage chambers and the low-voltage chambers may respectively be a plurality of rectangular parallelepiped arranged in a vertical direction as shown in FIG. 6, and the elongated high voltage bus bar and the low voltage bus bar may be respectively arranged in the high-voltage chamber and the low-voltage chamber. The high-voltage power inputted into the high-voltage input power distribution cabinet 1 is transmitted to the power supply modules along the vertically arranged high-voltage bus, and is converted into the low-voltage power by the power supply modules, and then is transmitted to the low-voltage output and control cabinet via the low-voltage bus bar that is vertically arranged. The wiring method is simple, and it is convenient to realize the isolation of high and low voltage in each cabinet body.

In an embodiment, the high-low conversion part, the high-voltage input part, and the low-voltage output and control part may be respectively made as a separate cabinet body to be isolated from each other or may be separated by partitions in the same cabinet body. In the high-low voltage conversion cabinet, the power supply modules may be expanded according to requirements, and the partitions are vertically installed to form high-voltage/low-voltage chamber, wherein the high-voltage chambers and low-voltage chambers are arranged at intervals. The partition isolates the input high voltage, the output low voltage and the control low voltage, which may reduce the clearance and creepage distance between the high-voltage chamber and the low-voltage chamber and the clearance and creepage distance between the high-voltage cavities and the low-voltage cavities, thereby reducing the size and weight of the cabinet body and types of the parts.

According to an exemplary embodiment of the present disclosure, the high-voltage input power distribution cabinet and the high-low voltage conversion cabinet are adjacent in a horizontal direction, and the high-low voltage conversion cabinet is adjacent to the low-voltage output and the control cabinet in a vertical direction. As shown in FIG. 7, white arrows indicate the distribution of the input high voltage line $L_1$, and the white arrows in the portion of the high-low voltage conversion cabinet virtualize the high voltage bus bar; black arrows indicate the distribution of the output low voltage line $L_3$, and the black arrows in the portion of the high-low voltage conversion cabinet virtualize the low voltage bus bar; and arrows with oblique lines indicate the distribution of the control line $L_2$.

In FIG. 7, the high-voltage input power distribution cabinet 1 is adjacent to the high-low voltage conversion cabinet 2 in a horizontal direction, the high-low voltage conversion cabinet 2 and the low-voltage output and control cabinet 3 are adjacent in a vertical direction, and the high-voltage chamber and the low-voltage chamber are alternately arranged in horizontal directions. The high-voltage chamber and the low-voltage chamber may be a plurality of rectangular parallelepipeds arranged in a vertical direction as shown in FIG. 7, and high voltage bus bars and low voltage bus bars with stripe shapes may be respectively arranged in the high-voltage chamber and the low-voltage chamber. The high-voltage power inputted into the high-voltage input power distribution cabinet 1 is transmitted to the power supply module along the high voltage bus bar vertically arranged, and is transferred to the low voltage output and control cabinet through the low voltage bus bar arranged vertically after being converted into low-voltage power via the power supply module. The wiring method requires multiple turns to achieve the isolation of the high voltage and low voltage in each cabinet body. The overall structure of the power supply system of the present exemplary embodiment is more compact, and the advantages are even more obvious in certain specific scenarios (such as the case in which the size in a certain dimension is strictly limited and required, or the case in which the width is strictly limited and required).

In an embodiment, at both sides of the high-low voltage conversion part, there are respectively a high-voltage power distribution part and a low-voltage output and control part. The high-voltage power distribution part and the low-voltage output and control part are distributed in the vertical direction. The high-low voltage conversion part, the high-voltage input part and the low-voltage output and control part may be respectively made as a separate cabinet body to be isolated from each other or may be separated by partitions in the same cabinet body. In the high-low voltage conversion cabinet, the power supply module is vertically expanded, and the partitions are vertically installed to form high-voltage chamber and low-voltage chamber, the high-voltage chamber and low-voltage chamber being arranged at intervals. The partition isolates the input high voltage, the output low voltage and the control low voltage, which may reduce the clearance and creepage distance between the high-voltage chamber and the low-voltage chamber and the clearance and creepage distance between the high-voltage cavities and the low-voltage cavities, thereby reducing the size and weight of the cabinet bodies and types of the components.

According to an exemplary embodiment of the present disclosure, the low-voltage chamber is also provided with a low-voltage control line (not shown).

According to an exemplary embodiment of the present disclosure, the high-voltage input power distribution cabinet, the high-low voltage conversion cabinet, and the low voltage output and control cabinet each adopts a separately isolated cabinet.

According to an exemplary embodiment of the present disclosure, the high-voltage input power distribution cabinet, the high-low voltage conversion cabinet, and the low voltage output and control cabinet are disposed in the same cabinet body and are separated by partitions.

According to an exemplary embodiment of the present disclosure, a high-voltage unit is disposed in a high-voltage cavity of the power supply module, and an isolation transformer and a low-voltage unit are disposed in the low-voltage cavity of the power supply module.

Specifically, as shown in FIG. 8, the high-voltage unit 2411 is disposed in the high-voltage cavity 241, and the isolation transformer 2421 and the low-voltage unit 2422 are disposed in the low-voltage cavity 242. The isolation cavity 2432 is disposed at one end of the low-voltage cavity and one end of the high-voltage cavity, for example, outside the high-voltage cavity and the low-voltage cavity of the cabinet body, for isolating the high-voltage portion from the operator directly in front of the cabinet body, so as to avoid damage to maintenance personnel due to arc discharge during live maintenance. A control unit 33 may be disposed in the low-voltage cavity of the power supply module. The high-voltage unit 2411 may include primary circuit of conversion circuit, and the low-voltage unit 2422 may include secondary circuit of conversion circuit, but the present disclosure is not limited thereto.

FIG. 16 is a circuit diagram of the power supply module according to an embodiment of the present disclosure. As shown in FIG. 16, the high-voltage unit 2411 is connected to the low-voltage unit 2422 through the isolation transformer 2421.

According to an exemplary embodiment of the present disclosure, there is provided with a fan (not shown) disposed in the isolation unit.

According to an exemplary embodiment of the present disclosure, there is one fan disposed in a position corresponding to the low-voltage cavity in the isolation unit.

According to an exemplary embodiment of the present disclosure, there are two fans, which are respectively disposed in positions corresponding to the high-voltage cavity and the low-voltage cavity in the isolation unit.

According to an exemplary embodiment of the present disclosure, the fan disposed in the position corresponding to the high-voltage cavity in the isolation unit is provided with an arc protection mechanism 2431. The arc protection mechanism 2431 may be a ventilable isolation structure such as a grounded metal mesh/grid, louver, etc., but the disclosure is not limited thereto.

The two schemes of the settings of the above-mentioned fans may correspond to power supply modules of different power levels and the same voltage level. For example, the scheme of two fans corresponds to a power supply module of a relatively high power level, and the scheme of one fan corresponds to a power supply module of a relatively low power level. However, the present disclosure is not limited thereto. The solutions of arc protection mechanism and fan may be disclosed as in FIG. 8.

According to an exemplary embodiment of the present disclosure, there may be one or more high-low voltage conversion cabinets. The inputs/outputs of the high-low voltage conversion cabinets may be connected in series or in parallel. The inputs of the high-low voltage conversion cabinets are connected in series to meet different high voltage inputs, such as 4~22KV, as shown in FIG. 9. The outputs of the high-low voltage conversion cabinets are connected in parallel to meet the outputs of different power levels. By setting variety of connections of different numbers of power supply modules, high-voltage bus bars and low-voltage bus bars, the requirements of different voltage inputs and power outputs can be met, and different occasions can be flexibly applied.

According to an exemplary embodiment of the present disclosure, the connecting terminal of the high-voltage cavity is an AC input series-parallel terminal 2442. As shown in FIG. 10 and FIG. 11, the AC input series-parallel terminals 2442 of different power supply modules may be selectively connected in series, in parallel, in series-parallel, etc. through the input serial bus bar 2443 and the input parallel bus bar 2444, and then they are further connected to the corresponding high-voltage bus bar through the input bus bar 2441, wherein the input serial bus bar 2443 and the input parallel bus bar 2444 may be disposed in the high-voltage chamber. For example, when needing to be connected in series, the AC input serial-parallel terminals 2442 of different power supply modules may be connected in series through the input serial bus bars 2443, and then are connected to the corresponding high-voltage bus bars through the input bus bar 2441; and when needing to be connected in parallel, the AC input serial-parallel terminals 2442 of different power supply modules may be connected in parallel through the input parallel bus bars 2444, and then are connected to the corresponding high-voltage bus bar through the input bus bar 2441. In one embodiment, the input parallel bus bar 2444 may be implemented directly by the high-voltage bus bar.

According to an exemplary embodiment of the present disclosure, the connecting terminal of the low-voltage cavity is a DC output serial-parallel terminal 2451. As shown in FIG. 12 and FIG. 13, the DC output series-parallel terminals 2451 of different power supply modules may be selectively connected in series, in parallel, in series-parallel, etc. through the output parallel bus bar 2452 and the output serial bus bar 2453, and then are connected to the corresponding low-voltage bus bars. For example, when needing to be connected in series, the DC output serial-parallel terminals 2451 of different power supply modules may be connected in series through the output series bus bars 2453, and then are connected to the corresponding low-voltage bus bars; when needing to be connected in parallel, the DC output series-parallel terminals 2451 of different power supply modules may be connected in parallel through the output parallel bus bars 2452, and then are connected to the corresponding low-voltage bus bar; and when more output power and larger output voltage are required at the same time, the DC output series-parallel terminals 2451 of different power supply modules may be connected in series through the output series bus bar 2453, then connected in parallel through the output parallel bus bars 2452, and then connected to the corresponding low-voltage bus bars. In one embodiment, the output parallel bus bar 2452 may be implemented directly by the low-voltage bus bar.

Taking a power supply module with a DC output voltage of 400V as an example, by directly connecting the outputs of the multiple power supply modules in parallel, the voltage output of DC400V can be realized; and by connecting the outputs of the multiple power supply module in series firstly and then connected in parallel, the voltage output of DC800V can be realized.

According to an exemplary embodiment of the present disclosure, an input of the power supply module is an AC input, and an output thereof is a DC output.

From the above detailed description, those skilled in the art will readily appreciate that a power supply system according to the embodiments of the present disclosure has one or more of the following advantages.

According to some exemplary embodiments of the present disclosure, safety is improved by isolating the input high voltage, the output low voltage and the control low voltage.

According to some exemplary embodiments of the present disclosure, the low-voltage portion does not require additional protection, thereby reducing the number and types of components.

According to some exemplary embodiments of the present disclosure, the clearance and creepage distance between the high-voltage chambers and low-voltage chambers and the clearance and creepage distance between the high-voltage cavities and low-voltage cavities are reduced, and thus the sizes and weights of the cabinet bodies are reduced.

According to some further exemplary embodiments of the present disclosure, the high-voltage cavity, the low-voltage cavity and a combination thereof may meet a variety of different system architectures.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A power supply system, comprising: a high-voltage input power distribution cabinet, a high-low voltage conversion cabinet, and a low-voltage output and control cabinet, wherein, the high-low voltage conversion cabinet is provided with at least one high-voltage chamber and at least one low-voltage chamber, the high-low voltage conversion cabinet is further provided with an insulating partition between the high-voltage chamber and the low-voltage chamber, the low-voltage chamber is provided with a low-voltage bus bar, and the high-voltage chamber is provided with a high-voltage bus bar;

the high-low voltage conversion cabinet is further provided with a plurality of power supply modules, and each of the power supply modules bridges the high-voltage chamber and the low-voltage chamber, the power supply module comprises a high-voltage cavity, a low-voltage cavity and an isolation unit, wherein a connecting terminal of the high-voltage cavity and a connecting terminal of the low-voltage cavity are respectively disposed corresponding to the high-voltage chamber and the low-voltage chamber and electrically connected to the high-voltage bus bar and the low-voltage bus bar respectively, and the isolation unit is connected to one end of the high-voltage cavity and one end of the low-voltage cavity.

2. The power supply system according to claim 1, wherein, the power supply system comprises a plurality of the high-voltage chambers, a plurality of the low-voltage chambers, and a plurality of the insulating partitions, and the high-voltage chambers and the low-voltage chambers are alternately arranged in a vertical direction.

3. The power supply system according to claim 2, wherein, the high-voltage input power distribution cabinet, the high-low voltage conversion cabinet, and the low-voltage output and control cabinet are sequentially arranged in a horizontal direction.

4. The power supply system according to claim 1, wherein, the power supply system comprises a plurality of the high-voltage chambers, a plurality of the low-voltage chambers, and a plurality of the insulating partitions, and the high-voltage chambers and the low-voltage chambers are alternately arranged in a horizontal direction.

5. The power supply system according to claim 4, wherein, the high-voltage input power distribution cabinet, the high-low voltage conversion cabinet, and the low-voltage output and control cabinet are sequentially arranged in a vertical direction.

6. The power supply system according to claim 4, wherein, the high-voltage input power distribution cabinet is adjacent to the high-low voltage conversion cabinet in the horizontal direction, and the high-low voltage conversion cabinet is adjacent to the low-voltage output and control cabinet in a vertical direction.

7. The power supply system according to claim 1, wherein, the low-voltage chamber is further provided with a low-voltage control line.

8. The power supply system according to claim 1, wherein, the high-voltage input power distribution cabinet, the high-low voltage conversion cabinet, and the low-voltage output and control cabinet adopt a separately isolated cabinet body, respectively.

9. The power supply system according to claim 1, the high-voltage input power distribution cabinet, the high-low voltage conversion cabinet, and the low-voltage output and control cabinet are disposed only in a cabinet body and are separated by a partition.

10. The power supply system according to claim 1, wherein, the high-voltage cavity is provided with a high-voltage unit, and the low-voltage cavity is provided with an isolation transformer and a low-voltage unit.

11. The power supply system according to claim 1, wherein, the isolation unit is provided with a fan.

12. The power supply system according to claim 11, wherein, the isolation unit is provided with only one fan, which is disposed at a position corresponding to the low-voltage cavity in the isolation unit.

13. The power supply system according to claim 11, wherein, the isolation unit is provided with two fans, which are respectively disposed at positions corresponding to the high-voltage cavity and the low-voltage cavity in the isolation unit.

14. The power supply system according to claim 13, wherein, one of the fans disposed at the position corresponding to the high-voltage cavity in the isolation unit is provided with an arc protection mechanism.

15. The power supply system according to claim 1, wherein, the connecting terminal of the high-voltage cavity is an AC input terminal, and the AC input terminals of the plurality of power supply modules are selectively connected in series through an input series bus bar disposed in the high-voltage cavity or in parallel through an input parallel bus bar disposed in the high-voltage cavity.

16. The power supply system according to claim 1, wherein, the connecting terminal of the low-voltage cavity is a DC output terminal, and the DC output terminals of the plurality of power supply modules are selectively connected in series through an output series bus bar disposed in the low-voltage or in parallel through an output parallel bus bar disposed in the low-voltage cavity.

17. The power supply system according to claim 1, wherein, the power supply module is provided with an AC input and a DC output.

* * * * *